United States Patent

Jun

[11] Patent Number: 5,948,705
[45] Date of Patent: Sep. 7, 1999

[54] METHOD OF FORMING INTERCONNECTION LINE

[75] Inventor: Young-Kwon Jun, Seoul, Rep. of Korea

[73] Assignee: LG Semicon Co., Ltd., Chungcheongbuk-do, Rep. of Korea

[21] Appl. No.: 08/937,589

[22] Filed: Sep. 29, 1997

[30] Foreign Application Priority Data

Oct. 23, 1996 [KR] Rep. of Korea .................. 96-47588

[51] Int. Cl.$^6$ .................................................. H01L 21/00

[52] U.S. Cl. ........................ 438/734; 438/672; 438/742

[58] Field of Search ............................ 438/631, 637, 438/672, 692, 720, 734, 742, 743; 216/38, 18, 67

[56] References Cited

U.S. PATENT DOCUMENTS

4,884,123 11/1989 Dixit et al. .
5,422,310 6/1995 Ito ........................................ 438/742 X

*Primary Examiner*—William Powell

[57] ABSTRACT

A method of forming an interconnection line of a semiconductor device includes the steps of forming an insulating layer on a substrate, forming a contact hole in the insulating layer, forming a first conductive material layer in the contact hole so that a top surface level of the first conductive material layer is the same as or higher than a top surface level of the insulating layer and so that a portion of the first conductive material layer remains on the insulating layer, and forming a second conductive material layer on the first conductive material layer as the portion of the first conductive material layer remaining on the insulating layer is removed.

22 Claims, 8 Drawing Sheets

METHOD OF FORMING INTERCONNECTION LINE

BACKGROUND OF THE INVENTION

1. Field of the Invention

The present invention relates to a method of forming an interconnection line of a semiconductor integrated circuit and, more particularly, to a method of forming an interconnection line in which a contact hole is substantially filled with a conductive material to thereby improve the resistance and reliability of the interconnection line.

2. Discussion of Related Art

Thin films formed with aluminum and aluminum alloys are widely utilized as an interconnection material for a semiconductor circuit because they have an electrical property of high conductivity, an easy pattern formation by dry etching, a good adhesion to a silicon oxide film, and an inexpensive cost.

Recently, the integration of an integrated circuit has increased with greater applicability. As a result, the size of the semiconductor device has decreased, the interconnection pattern has become finer and multilayered, the layer steps in the device have increased, and the aspect ratio of a contact hole or via hole has increased. Thus, it has become more important to form an interconnection line near the step coverage where severe steps, contact holes and via holes are present.

If an interconnection line is formed by sputtering, which is a conventional method of forming a metal interconnection line, the thickness of the interconnection layer decreases locally with steps or unevenness due to a shadow effect. The shadow effect is severe in contact holes having the aspect ratio above 1.

A chemical vapor deposition method is used instead of sputtering to achieve a more uniform thickness. Investigation has been conducted to improve the step coverage by forming a tungsten film using a low pressure chemical vapor deposition method. However, in this method it is difficult to adopt the tungsten interconnection line as an interconnection line because it has resistivity above two times that of the aluminum interconnection line. Therefore, a method of effectively forming a plug in the contact hole is still needed and many methods to achieve the same have been proposed.

Among the proposed methods, a selective CVD method is known where a tungsten film is grown selectively through an exposed substrate in the contact hole using a selective chemical vapor deposition (CVD) method, thereby forming a plug. Another method forms a barrier metal layer or a glue layer on the bottom and sidewalls of the contact hole, and then deposits and etches back the blanket tungsten film above the deposition thickness, thereby forming the plug.

In the selective CVD method, however, it is difficult to suppress the growth of the tungsten film on the insulating film. Thus, a collimator for passing only the vertically moving ions is need. In the blanket deposition and etch-back method, it is necessary to form in the contact hole a reliable barrier metal layer or glue layer with high aspect ratio. To achieve this the thickness of the barrier layer or glue layer must be above the minimum thickness to nucleate tungsten on the bottom and sidewalls of the contact hole using the CVD method.

Meanwhile, the surface level of the contact hole differs from that of the plug because the depth of the contact hole varies with the degree of planarization of the insulating layer. For example, the surface level of the plug may be lower than that of the contact hole. Further, in the aluminum reflow process where the contact hole is filled with a sputtered and annealed aluminum or an aluminum sputtered at a high temperature, aluminum flows into the contact hole due to its high mobility caused by rasing the substrate temperature to 500° C. In that case, Ti, TiN or the composite layer of Ti and TiN is used as an underlying layer prior to the aluminum deposition. But if the step coverage and the surface state of the underlying layer are poor, disconnection occurs on the sidewall of the contact hole and a void is formed in the contact hole.

In order to avoid such problems and to improve the step coverage in the contact hole, a conductive layer with low resistance such as aluminum, copper and silver, is deposited using a chemical vapor deposition (CVD) method. Aluminum may be deposited by DMAH or DMEAA [$(CH_3)_2(CH_3CH_2)N]AlH_3$ source, whereas copper may be deposited by (hfac)Cu(TMVS) [hexafluroacetylacetonate Cu trimethylvinylsilane] source. However, in the case of fabricating a conductive line with the fine line width below 0.5 $\mu$m, the reflectance and conductivity of the conducive line deteriorates and a uniform integrity is difficult to maintain, because the CVD films have a high degree of roughness. Accordingly, electromigration (EM) occurs and the reliability of the device formed by such methods is inadequate.

FIGS. 1A to 1D are partial cross-sectional views for illustrating a conventional method where a conductive line is formed after the formation of a tungsten plug.

Figure 1A:
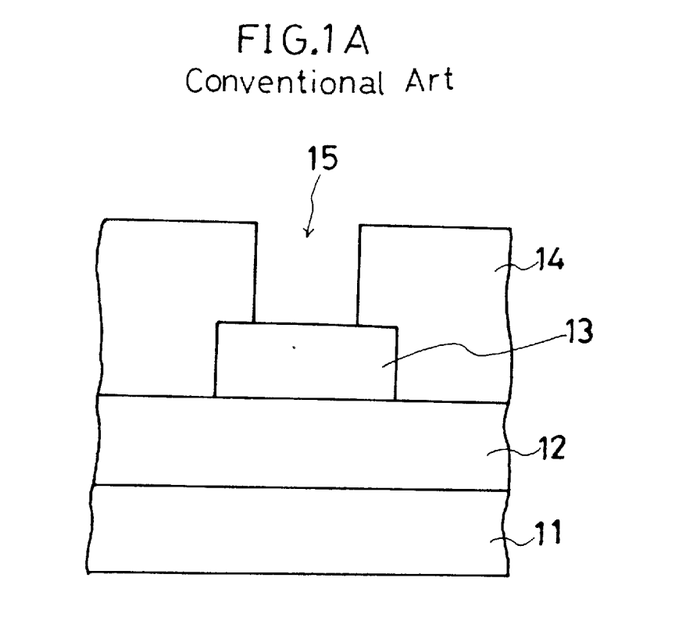
FIGS. 1A to 1D are cross-sectional views for illustrating a conventional method of forming an interconnection line of a semiconductor device.

As shown in FIG. 1A, an insulating layer 12 is formed on a substrate 11 and a lower interconnection line 13 is formed thereon. After an insulating layer 14 covers the entire surface of the formed structure, a via-hole or contact hole 15 is formed above the lower interconnection line 13.

Figure 1B:
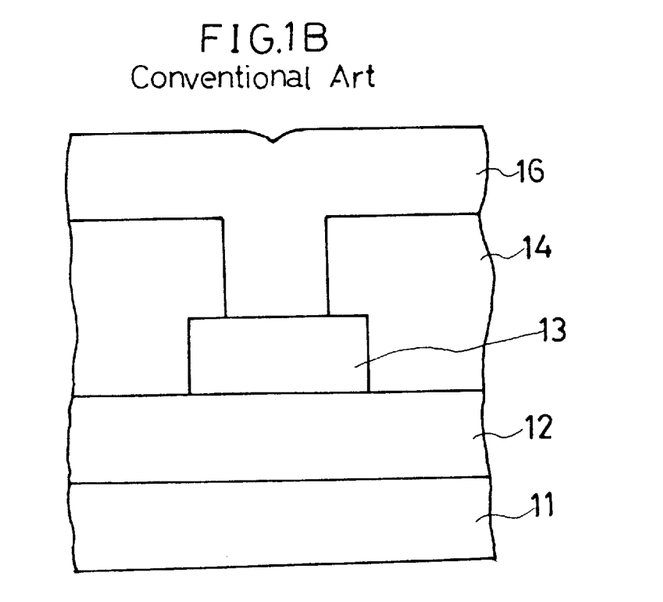
Figure 1C:
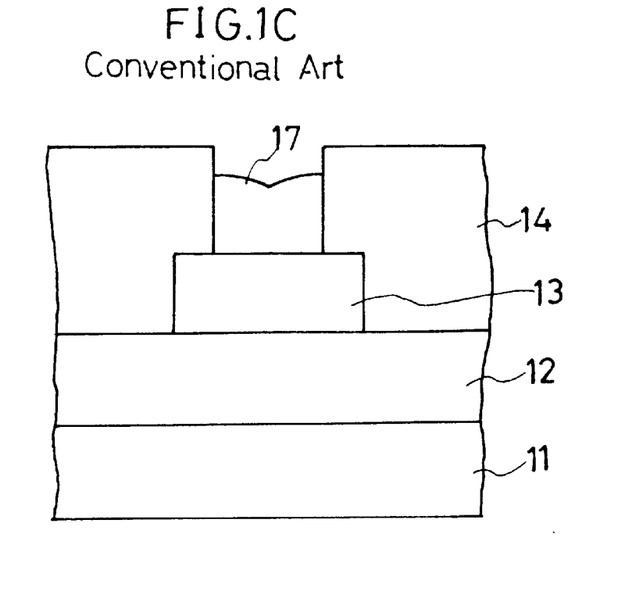
Figure 1D:
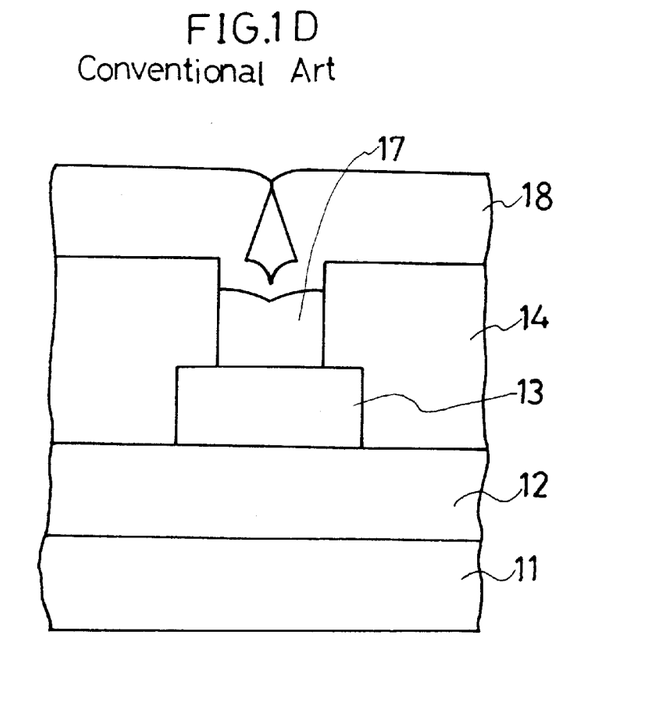

As shown in FIGS. 1B and 1C, a conductive material layer 16 is formed and etched back, thereby forming a plug 17 consisting of the conductive material in the hole 15. Then, as shown in FIG. 1D, a conductive material layer is formed on the entire surface and patterned to form an upper interconnection line 18.

However, in the conventional method and structure, the conductive material layer 16 is over-etched as the etch-back is performed to form the plug. As a result, portions of the steps of the insulating layer 14 are exposed and the surface level of the plug is lower than that of the via hole. Further, a recess is formed within the contact hole or interconnection line 18.

Figure 2A:
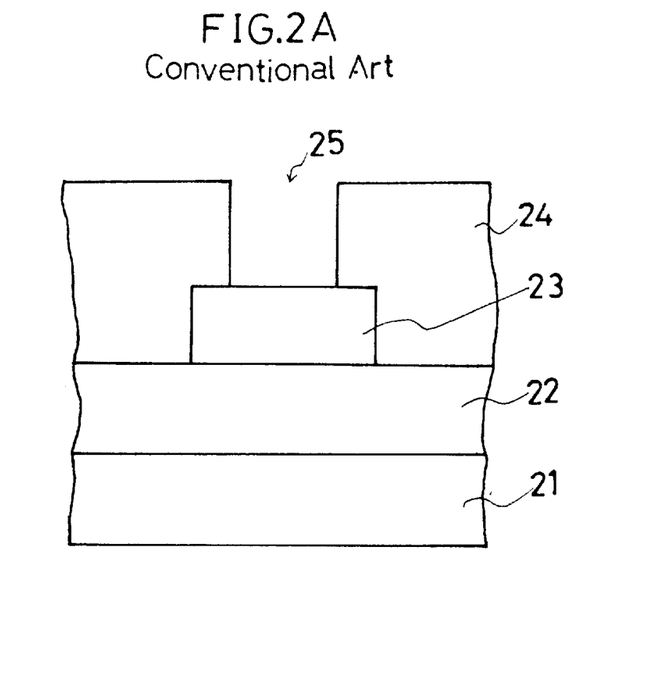
FIGS. 2A and 2B are cross-sectional views for illustrating another conventional method of forming an interconnection line of a semiconductor device.
Figure 2B:
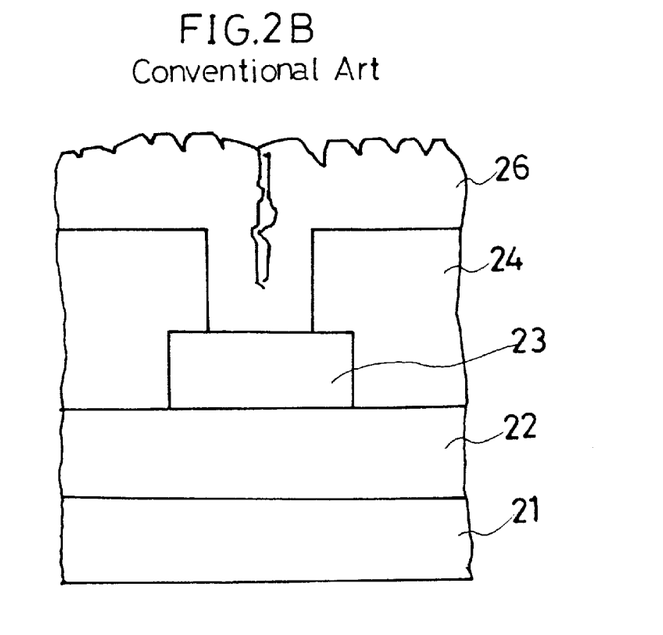

FIGS. 2A and 2B are partial cross-sectional views for illustrating another conventional method where a plug and a CVD film are formed with a same material at the same time. Here, the CVD film, e.g., aluminum, functions as a conductive line and fills the contact hole.

As shown in FIG. 2A, an insulating layer 22 is formed on a substrate 21 and a lower interconnection line 23 is formed thereon. After an insulating layer 24 covers the entire surface of the resultant, a via-hole 25 is formed above the lower interconnection line 23.

As shown in FIG. 2B, a conductive material layer 26 is deposited over the insulating layer 24 and patterned to form an upper interconnection line.

In this method, the process of forming the upper interconnection line can be simplified because the via-hole is also filled by the deposition. However, the reliability of the device deteriorates because the upper interconnection line has a rough surface.

As described above, the conventional method for forming an interconnection line has the following problems.

If a plug is formed using a selective tungsten deposition method or a blanket deposition and etch-back method, the depth of the contact hole is varied with the degree of planarization of the insulating layer. Therefore the surface level of the contact hole is substantially different from that of the plug. In general, this results in the plug having a top surface level which is lower than the surface level of the contact hole because the conductor material is over-etched during the etch-back process. Consequently, poor step coverage of the conductive line is obtained.

On the other hand, if the plug and the CVD (aluminum) film are formed at the same time, the reliability of the interconnection line deteriorates because the aluminum layer contains a rough surface.

SUMMARY OF THE INVENTION

Accordingly, the present invention is directed to a method of forming an interconnection line that substantially obviates one or more of the above and other problems due to limitations and disadvantages of the related art.

An object of the present invention is to provide a method for improving step coverage by solving the problems of the conventional methods arising when a conductive material with a high aspect ratio is formed in a contact hole.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purposes of the present invention, as embodied and broadly described, there are provided two methods as follows.

In a first method of the present invention, when a first conductive material layer is formed and etched back to form a plug filling a contact hole, the first conductive material layer is etched back to remain on the layer steps so that the surface level of the plug is substantially the same as that of the insulating layer, thereby improving the step coverage.

In a second method of the present invention, when the first conductive material layer is formed and etched back to form the plug filling the contact hole, the first conductive material layer is etched back so that the first conductive material layer remain on the surface of the insulating layer, thereby improving the step coverage.

The first method includes the steps of forming a conductive material layer after the formation of a contact hole; etching back the first conductive material layer so that the surface level thereof is almost same as that of the contact hole; forming a second conductive material layer thereon; and patterning the second conductive material layer, and simultaneously removing the residue of the first conductive material layer left on the steps using the second conductive material pattern or a photoresist film pattern as a mask, so as to form a second conductive.

The second method of the present invention includes the steps of forming a first conductive material layer in a contact hole and on an insulating layer; etching back the first conductive material layer so that the surface level of the first conductive material layer is higher than that of the contact hole; forming a second conductive material layer thereon; and selectively etching the second conductive material layer to form a second conductive material pattern, and simultaneously removing the first conductive material layer which is not covered with the second conductive material layer, by using the second conductive material pattern or a photoresist film pattern as a mask.

If the etch selectivities of the main components of both the first and second conductive material layers are the same, the first conductive material is patterned as the second conductive material is patterned. If the etch selectivities are different, the second conductive material pattern is formed and then the remaining first conductive material layer is removed.

It is to be understood that both the foregoing general description and the following detailed description are exemplary and explanatory and are intended to provide further explanation of the invention as claimed.

Briefly described, the embodiments of the present invention are directed to a method of forming an interconnection line of a semiconductor device including the steps of forming an insulating layer on a substrate, forming a contact hole in the insulating layer, forming a first conductive material layer filling the contact hole so that a top surface level of the first conductive material layer is the same as or higher than a top surface level of the insulating layer and so that a portion of the first conductive material remains on the insulating layer, and forming a second conductive material layer on the first conductive material layer as the portion of the first conductive material layer remaining on the insulating layer is removed.

BRIEF DESCRIPTION OF THE ATTACHED DRAWINGS

The accompanying drawings, which are included to provide a further understanding of the invention and are incorporated in and constitute a part of this specification, illustrate embodiments of the invention and together with the description serve to explain the principles of the drawings, wherein.

DETAILED DESCRIPTION OF PREFERRED EMBODIMENTS

Reference will now be made in detail to the preferred embodiments of the present invention, examples of which are illustrated in the accompanying drawings.

FIGS. 3A to 3E are partial cross-sectional views for illustrating a method of forming an interconnection line in accordance with the first embodiment of the present invention.

Figure 3A:
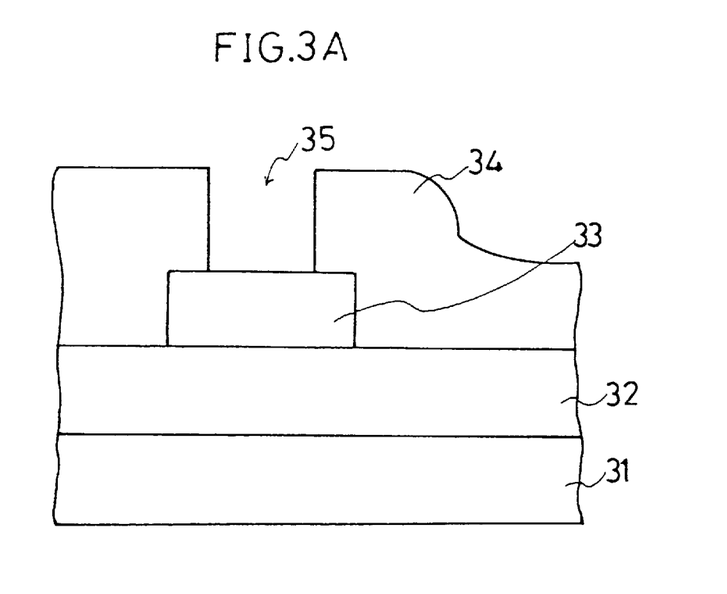
FIGS. 3A to 3E are cross-sectional views for illustrating a method of forming an interconnection line in accordance with a first embodiment of the present invention.

As shown in FIG. 3A, an insulating layer 32 is formed on a semiconductor substrate 31 and a lower interconnection line 33 is formed on the insulating layer 32. An oxide (first insulation layer) is formed on the insulating layer 32 and the lower interconnection line 33 to form another insulating layer 34. The insulating layer 34 electrically insulates the lower interconnection line 33. Thereafter, the insulating layer 34 is selectively etched to form a contact hole 35 for connecting the lower interconnection line 33 with an upper interconnection line, thereby exposing a portion of the lower interconnection line 33.

Figure 3B:
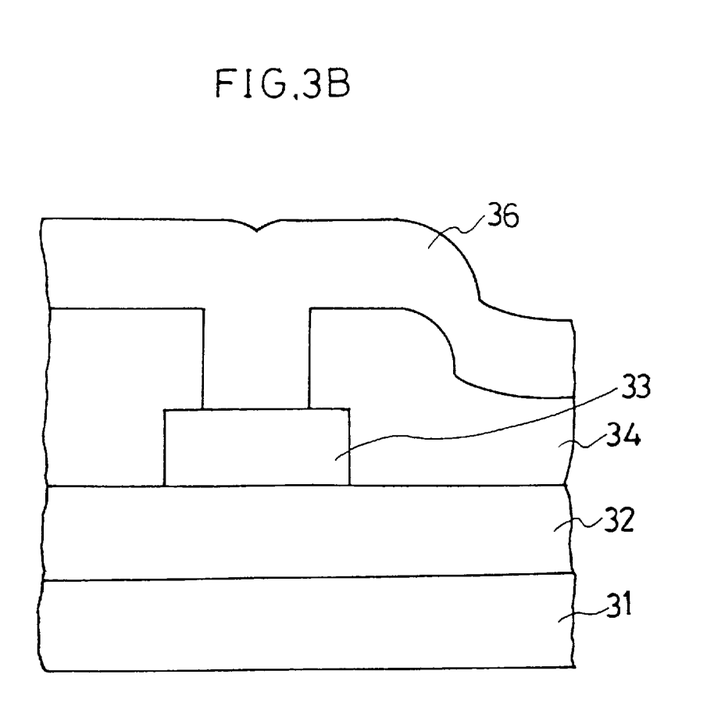

As shown in FIG. 3B, a first conductive material layer 36 is deposited with a thickness of about 1000~5000 Å using a CVD method, thereby filling the contact hole 35. The first conductive material layer 36 is composed of at least one of metals such as W, Al, Ag and Cu, or composed of an alloy having these metals as its main components. The deposition thickness of the first conductive material layer 36 is controlled so that it is greater than two times the radius of the contact hole 35.

Figure 3C:
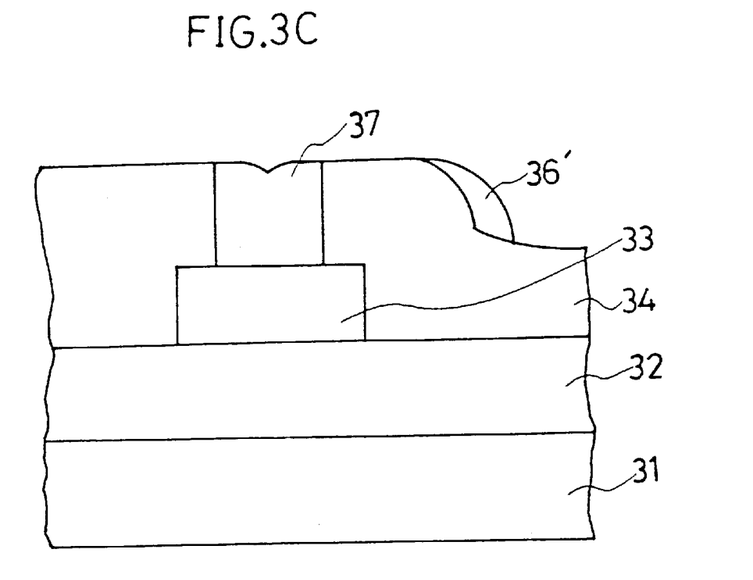

As shown in FIG. 3C, without using a photoresist mask, the first conductive material layer 36 is etched back using halogen gases including Cl and F, or is sputter etched using a plasma of inert gases such as Ar. The amount of etching is predetermined so that the surface level of the plug is the same or almost the same as that of the contact hole 35. This forms a plug 37 having a top surface which is flush with that of the insulating layer 34. The first conductive material layer 36 also remains partially on the insulating layer 34 as a residue 36'. The residue 36' of the first conductive material layer 36 functions as the sidewall covering the steps formed by the insulating layer 34.

Figure 3D:
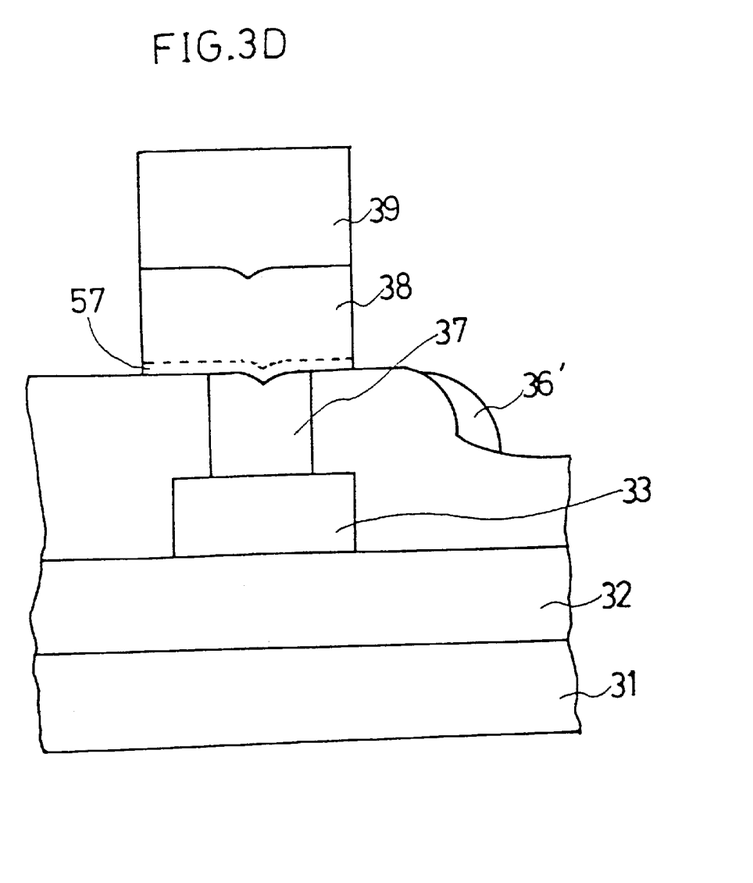

As shown in FIG. 3D, on the formed structure a second conductive material layer is deposited to a thickness of about 1000~5000 Å using a physical deposition method such as sputtering or CVD method. The second conductive material layer is composed of metals such as Al, Ag and Cu and/or alloys having these metals as their main components. A barrier metal layer between the first and second conductive materials may be formed to prevent reaction of the first and second conductive materials to each other. This avoids formation of a new material from the reaction when the second conductive material layer is formed or when the subsequent annealing is carried out. Here, a barrier metal layer 57 such as TiN, TiW or WN is inserted between the first and second conductive material layers to depress the reaction there between.

If the second conductive material layer were to be formed using the aluminum CVD layer, a metal organic (MO) CVD apparatus is utilized and the source gas such as dimethylethylamine alane (DMEAA), i.e., [(CH$_3$)$_2$(CH$_3$CH$_2$)N] AlH$_3$, is flowed into the apparatus by a carrier gas in the bubbler. The parameters for this process are as follows: the pressure of about 0.5~5 torr, the flow rate of about 100~1000 sccm, and the temperature of about 130~170° C. On the other hand, in order to form a copper CVD layer using a MO CVD, a liquid source such as (HFAC)Cu(TMVS), i.e., hexafluroacetylacetonate Cu trimethylvinylsilane or a solid source such as Cu(hfac)$_2$ is utilized.

After the second conductive material layer is formed, a photoresist film 39 is formed thereon. Using the photoresist film pattern 39 as a mask, the second conductive material layer is etched to form a second conductive material pattern 38, i.e., an interconnection line. If the etch selectivities of the main components of the first and second conductive material layers are the same, the residue 36' of the first conductive material 36 can be etched at the same time the second conductive material layer is etched to form the second conductive material pattern 38. That is, if the first and second conductive material layers are formed of an aluminum alloy and since an anisotropic etching using a Cl$_2$ gas is performed to form the second conductive material pattern 38, the residue 36' and the second conductive material layer can be etched and removed at the same time.

On the other hand, if the etch selectivities of the main components of the first and second conductive material layers are different, the residue 36' of the first conductive material 36 may be etched and removed using the photoresist film pattern 39 as a mask, or using the second conductive material pattern 38 as a mask after the photoresist film pattern 39 is completely removed. For example, if the plug 37 is formed with tungsten and the second conductive material is an aluminum alloy, the second conductive material pattern is formed by applying a plasma using gases including Cl$_2$. Thereafter, the remaining tungsten layer (i.e., the residue) is etched and removed by applying a plasma using gases including SF$_6$ and by utilizing the photoresist film or the aluminum alloy pattern as a mask.

Figure 3E:
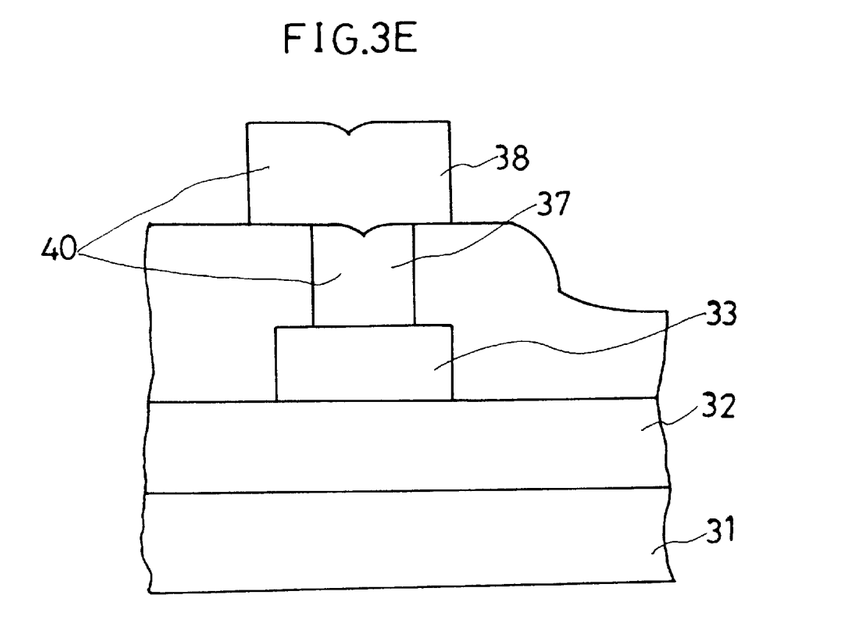

FIG. 3E shows the state in which the photoresist film pattern 39 and residue 36' of the first conductive material 36 are completely removed to form an upper interconnection line 40.

FIGS. 4A to 4E are partial cross-sectional views for illustrating a method of forming an interconnection line in accordance with the second embodiment of the present invention.

In the second embodiment, an interconnection line is formed by almost the same method as in the first embodiment, except that a first conductive material layer is etched back in such a manner so that the entrance of a contact hole is not exposed when a plug is formed.

Figure 4A:
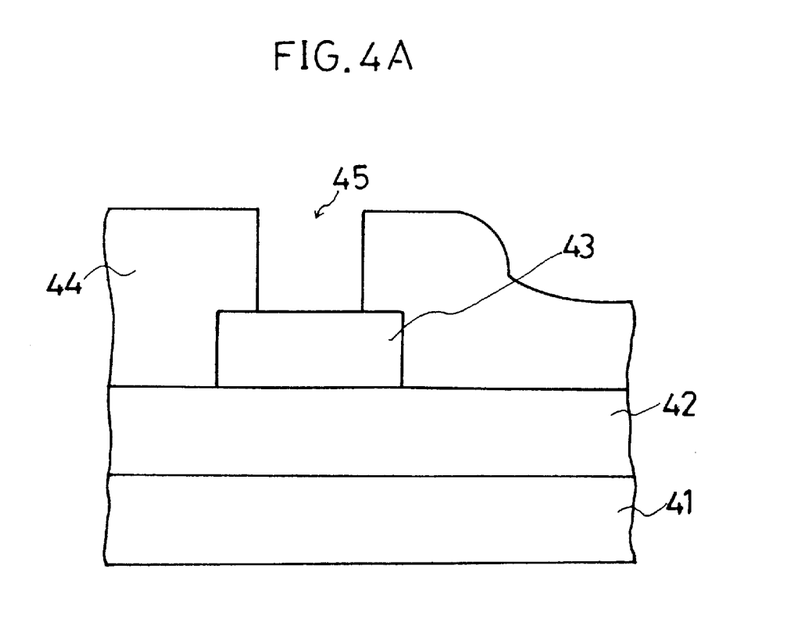
FIGS. 4A to 4E are cross-sectional views for illustrating a method of forming an interconnection line in accordance with a second embodiment of the present invention.

As shown in FIG. 4A, an insulating layer 42 is formed on a semiconductor substrate 41 and a lower interconnection line 43 is formed on the insulating layer 42. An oxide (first insulation layer) is formed on the insulating layer 42 as an insulating layer 44 to electrically insulate the lower interconnection line 43. Thereafter, the insulating layer 44 is selectively etched to form a contact hole 45 for connecting the lower interconnection line 43 with an upper interconnection line.

Figure 4B:
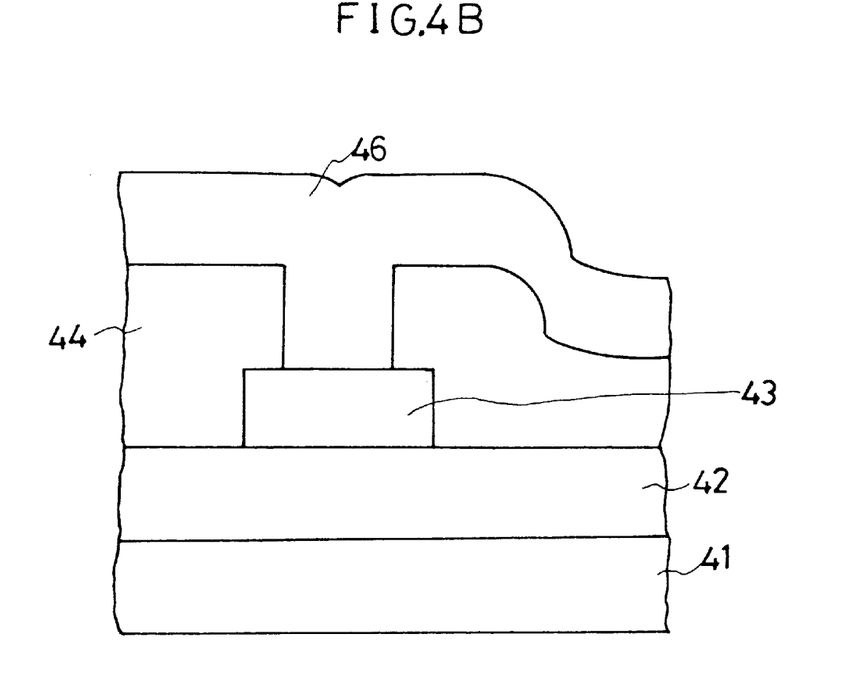

As shown in FIG. 4B, a first conductive material layer 46 formed with metals such as W, Al, Ag and Cu and alloys having these metals as main components, is deposited to a thickness of about 1000~5000 Å using the CVD method, thereby filling the contact hole 45 and covering the insulating layer 44.

Figure 4C:
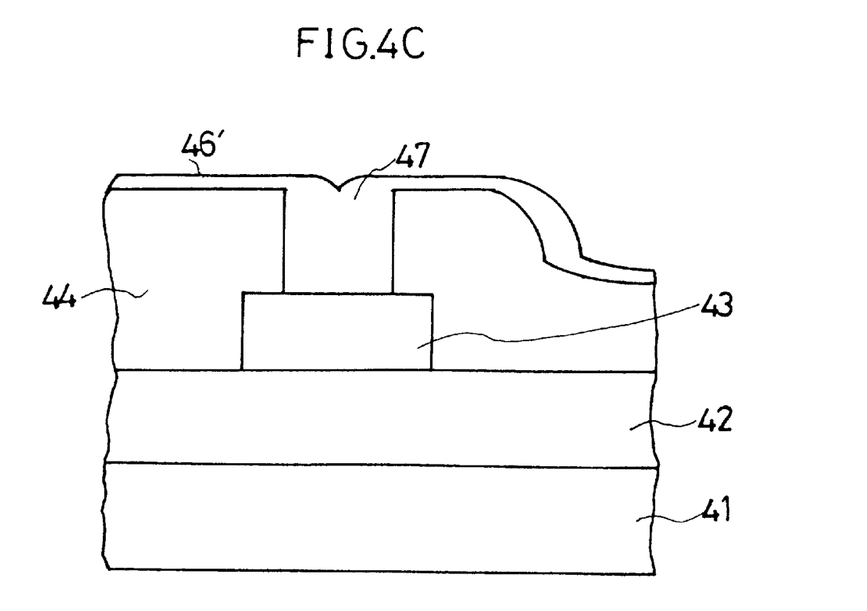

As shown in FIG. 4C, without using a photoresist mask, the first conductive material layer 46 is etched back using halogen gases including Cl and F, or sputter etched using a plasma of inert gases such as Ar. The etching amount is predetermined so that the top level of first conductive material layer 46 is higher than that of the contact hole 45. This results in a thin layer (residue 46') of the first conductive material layer 46 which remains on the entire insulating layer 44. It also forms a plug 47 filling the contact hole 45.

Figure 4D:
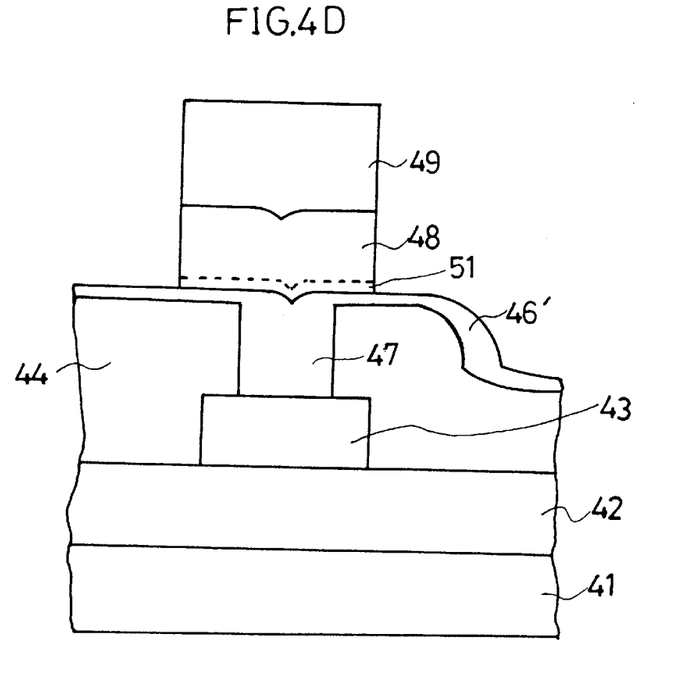

As shown in FIG. 4D, on the entire surface of the resultant, a second conductive material layer made of metals such as Al, Ag and Cu and alloys having these metals as main components, is deposited to a thickness of about 1000~5000Å using a physical deposition method, such as sputtering or CVD. To prevent reaction of the first and second conductive materials to each other during this deposition process or in the subsequent annealing process, a barrier metal layer 51 such as TiN, TiW and WN may be inserted between the first and second conductive layers to suppress the reaction. This prevents formation of a new material from the reaction.

If an aluminum CVD layer is used to form the second conductive material layer, a metal organic (MO) CVD apparatus is utilized and a source gas such as DMEAA is flowed into the apparatus by a carrier gas. The parameters for this process are as follows: the pressure of about 0.5~5 torr, the flow rate of about 100~1000 sccm, and the temperature of about 130~170° C.

On the other hand, if a copper CVD layer using MO CVD were to be formed as the second conductive material layer, a liquid source such as (HFAC)Cu(TMVS) or a solid source such as Cu(hfac)$_2$ is utilized.

After forming the second conductive material layer, a photoresist film pattern 49 is formed thereon. Using the photoresist film pattern 49 as a mask, the second conductive material layer is etched to form a second conductive material pattern 48 as an interconnection line. If the etch selectivities of the main components of the first and second conductive material layers are the same, the residue 46'of the first conductive material layer 46 is etched at the same time the second conductive material layer is etched to form the second conductive material pattern 48. For example, if the first and second conductive material layers are formed with an aluminum alloy and since an anisotropic etching using Cl$_2$ gas is performed when the second conductive material pattern is formed, both the residue 46' and the second conductive material layer can be etched and removed at the same time.

If the etch selectivities of the main components of the first and second conductive material layers are different, the residue 46' of the first conductive material layer 46 may be etched and removed using the photoresist film pattern 49 as a mask, or using the second conductive material pattern 48 as a mask after the photoresist film pattern 49 is removed.

Figure 4E:
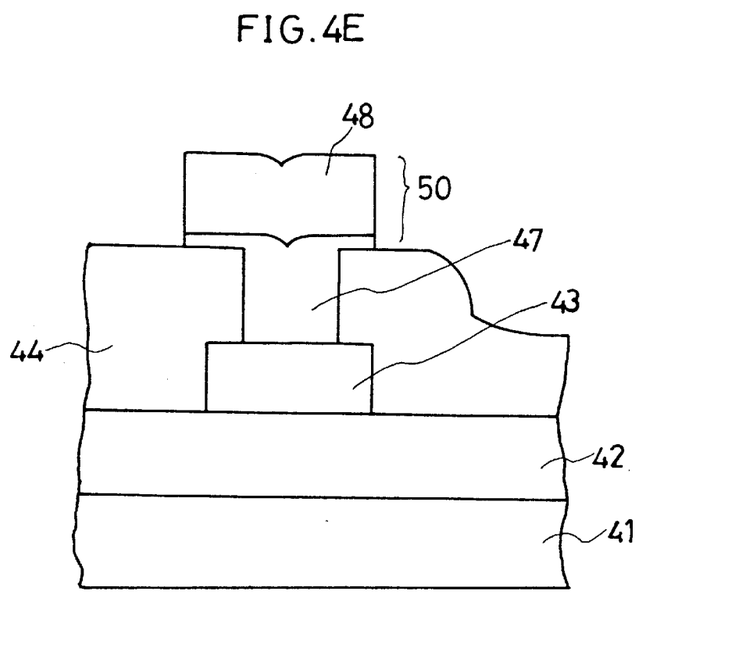

FIG. 4E shows that the photoresist film pattern 49 and the residue 46' of the first conductive material layer 46 are completely removed to form an upper interconnection line 50.

According to the first and second embodiments of the invention, the interconnection line formed as described above has improved reliability because a recess formation in the contact hole or the interconnection line as in the conventional art is prevented. This prevents deterioration of the step coverage in the contact hole. Particularly, if the first conductive material is formed by the aluminum CVD method, the resistance of the plug is substantially decreased.

Further, the present invention can utilize the physical deposition method such as sputtering as the method of forming the conductive line on the plug, thereby improving the application process.

It will be apparent to those skilled in the art that various modifications and variations can be made in a method of forming an interconnection line of the present invention without departing from the spirit or scope of the invention. Thus, it is intended that the present invention cover the modifications and variations of this invention provided they come within the scope of the appended claims and their equivalents.

What is claimed is:

1. A method of forming an interconnection line, comprising the steps of:

forming an insulating layer on a substrate;

forming a contact hole in the insulating layer;

forming a first conductive material layer in the contact hole so that a top surface level of the first conductive material layer is the same as or higher than a top surface level of the insulating layer and so that a portion of the first conductive material layer remains on the insulating layer; and forming a second conductive material layer on the first conductive material layer as the portion of the first conductive material layer remaining on the insulating layer is removed.

2. A method of forming an interconnection line as claimed in claim 1, wherein the first conductive material layer is formed of any one selected from metal groups of W, Al, Ag and Cu and alloy thereof.

3. A method of forming an interconnection line as claimed in claim 1, wherein the step of forming the first conductive material layer includes the steps of:

depositing a first conductive material in the contact hole and on the insulating layer; and selectively removed by an etch-back process the first conductive material.

4. A method of forming an interconnection line as claimed in claim 1, wherein the second conductive material layer is formed with one of a sputtering method and a chemical vapor deposition (CVD) method.

5. A method of forming an interconnection line as claimed in claim 1, wherein the step of forming the first conductive material layer includes the steps of:

depositing a first conductive material in the contact hole and on the insulating layer; and selectively removing the first conductive material so that the top surface level of the first conductive material layer is the same as the top surface level of the insulating layer, and so that a residue portion of the first conductive material remains on a portion of the insulating layer.

6. A method of forming an interconnection line as claimed in claim 5, wherein the step of forming the second conductive material layer includes the steps of:

depositing a second conductive material on the first conductive material layer; and removing a portion of the second conductive material and the residue portion of the first conductive material to form the second conductive material layer.

7. A method of forming an interconnection line as claimed in claim 6, wherein if etch selectivities of main components of the first and second conductive material layers are the same, the step of removing the portion of the second conductive material includes the step of:

simultaneously etching the second conductive material and the residue portion of the first conductive material.

8. A method of forming an interconnection line as claimed in claim 6, wherein if etch selectivities of main components of the first and second conductive material layers are different, the removing step includes the step of:

removing the residue portion of the first conductive material using the second conductive material layer as a mask.

9. A method of forming an interconnection line as claimed in claim 6, wherein if etch selectivities of main components of the first and second conductive material layers are different, the removing step includes the step of:

removing the residue portion of the first conductive material using a mask used to form the second conductive material layer.

10. A method of forming an interconnection line as claimed in claim 1, wherein the step of forming the first conductive material layer includes the steps of:

depositing a first conductive material in the contact hole and on the insulating layer; and selectively removing the first conductive material so that the top surface level of the first conductive material layer is higher than the top surface level of the insulating layer, and so that a residue layer of the first conductive material remains on the entire surface of the insulating layer.

11. A method of forming an interconnection line as claimed in claim 10, wherein the step of forming the second conductive material layer includes the steps of:

depositing a second conductive material on the first conductive material layer; and removing a portion of the second conductive material and the residue layer of the first conductive material to form the second conductive material layer.

12. A method of forming an interconnection line as claimed in claim 11, wherein if etch selectivities of main components of the first and second conductive material layers are the same, the step of removing the portion of the second conductive material includes the step of:

simultaneously etching the second conductive material and the residue layer of the first conductive material.

13. A method of forming an interconnection line as claimed in claim 11, wherein if etch selectivities of main components of the first and second conductive material layers are different, the step of removing the portion of the second conductive material includes the step of:

removing the residue layer of the first conductive material using the second conductive material layer as a mask.

14. A method of forming an interconnection line as claimed in claim 11, wherein if etch selectivities of main components of the first and second conductive material layers are different, the step of removing the portion of the second conductive material includes the step of:

removing the residue layer of the first conductive material using a mask used to form the second conductive material layer.

15. A method of forming an interconnection line as claimed in claim 1, further comprising the step of:

forming a barrier metal layer between the first and second conductive material layers prior to the step of forming the second conductive material layer but after the first conductive material layer is formed, so as to suppress a reaction therebetween.

16. A method of forming an interconnection line as claimed in claim 15, wherein the barrier metal layer includes one of TiN, TiW and WN.

17. A method of forming an interconnection line as claimed in claim 1, wherein at least one of the first and second conductive material layers has a thickness of approximately 1000~5000 Å.

18. A method of forming an interconnection line as claimed in claim 1, wherein the step of forming the first conductive material layer includes the steps of:

forming a first conductive material over the insulating layer; and etching back the first conductive material using halogen gases including Cl and F.

19. A method of forming an interconnection line as claimed in claim 1, wherein the step of forming the first conductive material layer includes the steps of:

forming a first conductive material over the insulating layer; and sputter etching the first conductive material using a plasma of inert gases.

20. A method of forming an interconnection line as claimed in claim 1, wherein the second conductive material layer is formed using a metal organic chemical vapor deposition apparatus and using a source gas of dimethylethylamine alane (DMEAA) $[(CH_3)_2(CH_3CH_2) N]AlH_3$.

21. A method of forming an interconnection line as claimed in claim 20, wherein the second conductive material layer is formed under the following condition:

a pressure of 0.5~5 torr, a flow rate of 100~1000 sccm, and a temperature of 130~170° C.

22. A method of forming an interconnection line as claimed in claim 1, wherein the second conductive material layer is formed using a metal organic chemical vapor deposition process, and one of hexafluroacetylacetonate Cu trimethylvinylsilane [(HFAC)Cu(TMVS)] and $Cu(hfac)_2$.

* * * * *